(12) United States Patent　(10) Patent No.: US 10,190,217 B2
Honda et al.　(45) Date of Patent: Jan. 29, 2019

(54) PLASMA FILM-FORMING METHOD AND PLASMA FILM-FORMING APPARATUS

(71) Applicant: Tokyo Electron Limited, Tokyo (JP)

(72) Inventors: Minoru Honda, Yamanashi (JP); Toshio Nakanishi, Yamanashi (JP); Masashi Imanaka, Yamanashi (JP); Cheonsoo Han, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/627,583

(22) Filed: Jun. 20, 2017

(65) Prior Publication Data

US 2017/0370000 A1　Dec. 28, 2017

(30) Foreign Application Priority Data

Jun. 24, 2016　(JP) .................. 2016-125087

(51) Int. Cl.
*H01L 21/02*　(2006.01)
*C23C 16/511*　(2006.01)
*C23C 16/34*　(2006.01)
*H01J 37/32*　(2006.01)

(52) U.S. Cl.
CPC .......... *C23C 16/511* (2013.01); *C23C 16/345* (2013.01); *H01J 37/3222* (2013.01); *H01J 37/3244* (2013.01); *H01J 37/32467* (2013.01); *H01L 21/0217* (2013.01); *H01L 21/02211* (2013.01); *H01L 21/02274* (2013.01); *H01J 2237/3321* (2013.01)

(58) Field of Classification Search
CPC ................ H01L 21/02; H01L 21/0217; H01L 21/02211; H01L 21/02274; H01J 1/62; H01J 37/3222; H01J 37/3244; H01J 37/32467; H01J 37/32; H01J 2237/3321
USPC .......................................... 438/792
See application file for complete search history.

(56) References Cited

U.S. PATENT DOCUMENTS

2002/0039625 A1\* 4/2002 Powell .................. C23C 16/452
427/569
2012/0252226 A1\* 10/2012 Kabe ........................ C23C 8/36
438/772
2017/0330745 A1\* 11/2017 Nagashima ....... H01L 21/02389

FOREIGN PATENT DOCUMENTS

JP　2009-246129 A　10/2009
JP　2011-077323 A　4/2011
KR　10-2013-0131242 A　12/2013

\* cited by examiner

*Primary Examiner* — Chuong A Luu
(74) *Attorney, Agent, or Firm* — Abelman, Frayne & Schwab

(57) ABSTRACT

Disclosed is a plasma film-forming method including: accommodating a workpiece in a chamber; supplying a film-forming gas into the chamber; generating plasma within the chamber; and exciting the film-forming gas by the plasma to form a predetermined film on the workpiece. Helium gas is supplied as a plasma generating gas into the chamber together with the film-forming gas to generate plasma containing the helium gas in the chamber.

10 Claims, 4 Drawing Sheets

PLASMA FILM-FORMING METHOD AND PLASMA FILM-FORMING APPARATUS

CROSS-REFERENCE TO RELATED APPLICATIONS

This application is based on and claims priority from Japanese Patent Application No. 2016-125087 filed on Jun. 24, 2016 with the Japan Patent Office, the disclosure of which is incorporated herein in its entirety by reference.

TECHNICAL FIELD

The present disclosure relates to a plasma film-forming method and a plasma film-forming apparatus using microwave plasma.

BACKGROUND

In a process of manufacturing a semiconductor device, various films are formed as, for example, an insulating film, a protective film, and an electrode film. Plasma CVD has been known as a method for forming such various films by exciting a film-forming gas by plasma to form a predetermined film on a substrate.

For example, Japanese Patent Laid-Open Publication No. 2009-246129 discloses a technique of supplying a silicon source gas, a nitrogen-containing gas, and an argon gas, which is a plasma generating gas, into a chamber, and forming a silicon nitride film by CVD.

The argon gas as the plasma generating gas is not essential, but may be used for stably generating the plasma. Further, Japanese Patent Laid-Open Publication No. 2011-077323 discloses that other rare gases may be used as the plasma generating gas. In fact, however, argon gas is used as the plasma generating gas in most cases.

SUMMARY

According to a first aspect of the present disclosure, there is provided a plasma film-forming method including: placing a workpiece within a chamber; supplying a film-forming gas into the chamber; generating plasma within the chamber; and exciting the film-forming gas by the plasma to form a predetermined film on the workpiece. Helium gas is supplied as a plasma generating gas into the chamber together with the film-forming gas to generate plasma containing the helium gas within the chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
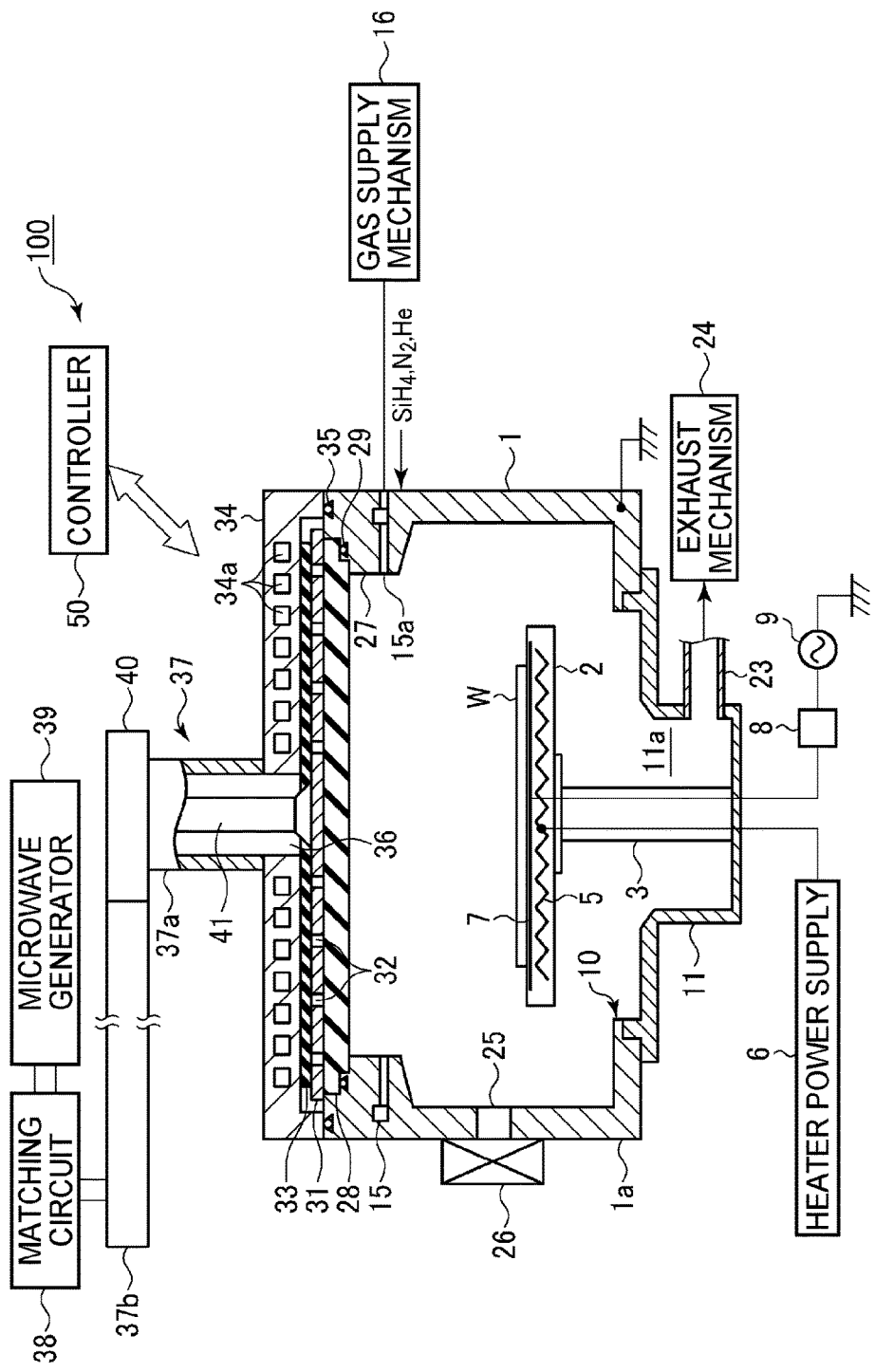
FIG. 1 is a cross-sectional view illustrating an exemplary plasma film-forming apparatus to which a plasma film-forming method according to an exemplary embodiment of the present disclosure may be applied.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

With recent miniaturization of semiconductor devices, a demand for film thickness uniformity and film quality uniformity has been increasing in the film forming processing. However, when argon gas was used as the plasma generation gas, it has been found that sufficient film thickness uniformity and film quality uniformity could not be obtained, but rather deteriorated in some cases. On the other hand, when a plasma processing is performed without using argon gas in order to avoid such a problem, plasma stability may be insufficient.

Accordingly, the present disclosure is to provide a plasma film-forming method and a plasma film-forming apparatus capable of generating plasma with high stability and uniformity and obtaining a film with high uniformity.

According to a first aspect of the present disclosure, there is provided a plasma film-forming method including: placing a workpiece within a chamber; supplying a film-forming gas into the chamber; generating plasma within the chamber; and exciting the film-forming gas by the plasma to form a predetermined film on the workpiece. Helium gas is supplied as a plasma generating gas into the chamber together with the film-forming gas to generate plasma containing the helium gas within the chamber.

According to a second aspect of the present disclosure, there is provided a plasma film-forming apparatus including: a chamber that accommodates a workpiece; a substrate holding member that holds the workpiece within the chamber; a gas supply mechanism that supplies a gas into the chamber; an exhaust mechanism that exhausts an atmosphere within the chamber; and a plasma generating unit that generates plasma within the chamber. The gas supply mechanism supplies a film-forming gas for forming a predetermined film on the workpiece and helium gas serving as a plasma generating gas into the chamber, and the plasma generating unit generates plasma containing the helium gas within the chamber, and the film-forming gas is excited by the plasma to form a predetermined film on the workpiece.

In the present disclosure, the plasma generated within the chamber may be microwave plasma. In this case, the microwave plasma may be generated by an RLSA (registered trademark) microwave plasma processing apparatus.

Further, a partial pressure ratio of the film-forming gas to the helium gas may be in a range of 0.15 to 2.5.

The film-forming gas may include a silicon source gas and a nitrogen-containing gas to form a silicon nitride film as the predetermined film. In this case, a processing temperature of the workpiece may be in a range of 250° C. to 550° C., and a processing pressure within the chamber may be in a range of 6.5 Pa to 100 Pa.

In the present disclosure, the plasma generating unit may generate microwave plasma within the chamber.

The plasma generating unit may include a microwave generator that generates microwaves, a planar antenna having a slot that radiates the microwaves, and a microwave-transmitting plate made of a dielectric constituting a top wall of the chamber. The plasma generating unit may generate the microwave plasma within the chamber by radiating the microwaves into the chamber through the slot of the planar antenna and the microwave-transmitting plate to supply the microwaves into the chamber.

The gas supply mechanism may supply the film-forming gas and the helium gas at a partial pressure ratio of 0.15 to 2.5.

The gas supply mechanism supplies a silicon source gas and a nitrogen-containing gas as the film-forming gas to form a silicon nitride film as the predetermined film.

The plasma film-forming apparatus may further include a temperature control unit that controls a processing temperature of the workpiece to be in a range of 250° C. to 550° C.

The plasma film-forming apparatus may further include a pressure control unit that controls a processing pressure in the chamber to be in a range of 6.5 Pa to 100 Pa.

According to the present disclosure, when forming a predetermined film on a processing target substrate by exciting a film-forming gas with plasma, helium gas is supplied as a plasma generating gas together with the film-forming gas into the chamber to generate plasma containing helium gas. Thus, a highly stable and uniform plasma may be generated, and a film with high uniformity in film thickness and film quality may be obtained.

Hereinafter, various exemplary embodiments of the present disclosure will be described in detail with reference to the drawings.

<Plasma Film-Forming Apparatus>

FIG. 1 is a cross-sectional view illustrating an exemplary plasma film-forming apparatus to which a plasma film-forming method according to an exemplary embodiment of the present disclosure may be applied. The plasma processing apparatus of FIG. 1 is configured as an RLSA (registered trademark) microwave plasma film-forming apparatus to form a silicon nitride (SiN) film on a semiconductor wafer (hereinafter, simply referred to as a "wafer") by plasma CVD.

As illustrated in FIG. 1, the plasma film-forming apparatus 100 includes a substantially cylindrical chamber 1 which is airtightly configured and grounded. A circular opening 10 is formed in a substantially central portion of a bottom wall 1a of the chamber 1, and an exhaust chamber 11 is provided in the bottom wall 1a to communicate with the opening 10 and protrude downward.

A susceptor 2 made of ceramics (e.g., AlN) is provided in the chamber 1 to horizontally support a workpiece, for example, a wafer W. The susceptor 2 is supported by a cylindrical support member 3 made of ceramics (e.g., AlN) that extends upward from the center of the bottom of the exhaust chamber 11. Further, a resistance heating type heater 5 is embedded in the susceptor 2. The heater 5 heats the susceptor 2 by supplying power from the heater power supply 6 to heat the wafer W. Further, an electrode 7 is embedded in the susceptor 2. The electrode 7 is connected with a high frequency power supply 9 for bias application via a matcher 8.

Wafer lift pins (not illustrated) for supporting and lifting the wafer W are provided in the susceptor 2 so as to protrude and retract from the surface of the susceptor 2.

An annular gas introduction portion 15 is provided in the sidewall of the chamber 1, and gas ejection holes 15a are evenly formed in the gas introduction portion 15. The gas introduction portion 15 is connected with a gas supply mechanism 16.

The gas supply mechanism 16 supplies a Si source gas, a nitrogen-containing gas, and helium gas (He) serving as a plasma generating gas. Examples of the Si source gas include monosilane ($SiH_4$) and disilane ($Si_2H_6$). Examples of the nitrogen-containing gas include $N_2$ gas and ammonia ($NH_3$). These gases are supplied to the gas introduction portion 15 from respective gas supply sources at flow rates independently controlled by flow rate controllers such as, for example, mass flow controllers via separate pipes. In FIG. 1, $SiH_4$ gas is used as the Si source gas, and $N_2$ gas is used as the nitrogen-containing gas.

A second gas introduction portion (e.g., a shower plate) may be provided below the gas introduction unit 15 so that a gas which may not be completely dissociated by plasma (e.g., a silicon source gas) is supplied from the second gas introduction portion to a region closer to the wafer W where the electron temperature is lower.

An exhaust pipe 23 is connected to a lateral side of the exhaust chamber 11, and an exhaust mechanism 24 including, for example, a vacuum pump or an automatic pressure control valve is connected to the exhaust pipe 23. The vacuum pump of the exhaust mechanism 24 is operated such that the gas in the chamber 1 is uniformly discharged into a space 11a of the exhaust chamber 11 and exhausted through the exhaust pipe 23, and the inside of the chamber 1 is controlled to a predetermined degree of vacuum by the automatic pressure control valve.

The side wall of the chamber 1 is provided with a carry-in/out port 25 that carries a wafer W into/out of a conveyance chamber (not illustrated) adjacent to the plasma film-forming apparatus 100, and a gate valve 26 that opens and closes the carry-in/out port 25.

The upper portion of the chamber 1 is configured as an opening portion, and the peripheral portion of the opening portion is configured as a ring-shaped supporting portion 27. A disc-shaped microwave-transmitting plate 28 made of a dielectric material (e.g., quartz or $Al_2O_3$) is airtightly provided in the supporting portion 27 through a sealing member 29. Accordingly, the inside of the processing container 1 is airtightly maintained.

A disc-shaped planar antenna 31 corresponding to the microwave transmitting plate 28 is provided above the microwave-transmitting plate 28 so as to be in close contact with the microwave-transmitting plate 28. The planar antenna 31 is locked to the upper end of the side wall of the chamber 1. The planar antenna 31 is constituted with a disc made of a conductive material.

For example, the planar antenna 31 is formed of a copper or aluminum plate whose surface is silver- or gold-plated, and has a configuration in which a plurality of slots 32 for radiating microwaves are formed so as to penetrate therethrough. An exemplary pattern of the slots 32 may be configured that two slots 32 arranged in a T shape are paired, and a plurality of the pairs of slots 32 are arranged concentrically. The length and arrangement interval of the slots 32 are determined depending on the wavelength ($\lambda g$) of the microwaves. For example, the slots 32 are arranged such that the interval thereof is $\lambda g/4$, $\lambda g/2$, or $\lambda g$. The slots 32 may have other shapes such as, for example, a circular shape or an arc shape. Further, the arrangement form of the slots 32 is not particularly limited, and the slots 32 may be arranged in, for example, a spiral shape or a radial shape besides the concentric shape.

A slow-wave plate 33 made of a dielectric material having a dielectric constant larger than that of vacuum (e.g., quartz or a resin such as polytetrafluoroethylene or polyimide) is closely attached to the upper surface of the planar antenna 31. The slow-wave plate 33 has a function of making the wavelength of the microwave shorter than that in the vacuum to reduce the size of the planar antenna 31.

The planar antenna 31 and the microwave-transmitting plate 28 are in close contact with each other. In addition, the slow-wave plate 33 and the planar antenna 31 are also in close contact with each other. Further, the thicknesses of the microwave-transmitting plate 28 and the slow-wave plate 33 are adjusted such that an equivalent circuit formed by the slow-wave plate 33, the planar antenna 31, the microwave-transmitting plate 28, and the plasma satisfies the resonance condition. The phase of the microwaves may be adjusted by adjusting the thickness of the slow-wave plate 33. Thus, when the thickness is adjusted such that the joint portion of the planar antenna 31 becomes an "antinode" of the standing waves, reflection of the microwaves is minimized, and radiation energy of the microwaves is maximized. Further, when the slow-wave plate 33 and the microwave-transmitting plate 28 are made of the same material, interface reflection of the microwaves may be suppressed.

The planar antenna 31 and the microwave-transmitting plate 28, and the slow-wave plate 33 and the planar antenna 31 may be spaced apart from each other.

A shield cover 34 made of a metal material (e.g., aluminum, stainless steel, or copper) is provided on the upper surface of the chamber 1 to cover the planar antenna 31 and the slow-wave plate 33. The upper surface of the chamber 1 and the shield cover 34 are sealed by a seal member 35. The shield cover 34 includes a cooling water flow path 34a formed therein, so that cooling water flows therethrough to cool the shield cover 34, the slow-wave plate 33, the planar antenna 31, and the microwave-transmitting plate 28. The shield cover 34 is grounded.

An opening 36 is formed in the center of the upper wall of the shield cover 34, and a waveguide 37 is connected to the opening. A microwave generator 39 is connected to an end portion of the waveguide 37 via a matching circuit 38. Therefore, microwaves with, for example, a frequency of 2.45 GHz generated by the microwave generator 39 are propagated to the planar antenna 31 via the waveguide 37. Various frequencies such as, for example, 8.35 GHz, 1.98 GHz, 860 MHz, or 915 MHz may be used as the frequency of the microwave.

The waveguide 37 includes a coaxial waveguide 37a having a circular cross section and extending upward from the opening 36 of the shield cover 34 and a rectangular waveguide 37b extending in the horizontal direction and connected to the upper end portion of the coaxial waveguide 37a via a mode converter 40. The mode converter 40 between the rectangular waveguide 37b and the coaxial waveguide 37a has a function of converting the microwave propagated in the TE mode in the rectangular waveguide 37b to the TEM mode. An inner conductor 41 extends in the center of the coaxial waveguide tube 37a, and the lower end portion of the inner conductor 41 is connected and fixed to the center of the planar antenna 31. Therefore, the microwaves are uniformly and efficiently propagated to the planar antenna 31 via the inner conductor 41 of the coaxial waveguide 37a.

The plasma film-forming apparatus 100 includes a controller 50. The controller 50 includes a main controller having a CPU (computer) that controls respective components of the plasma film-forming apparatus 100, for example, the microwave generator 39, the heater power source 6, the high-frequency power source 9, the exhaust mechanism 24, and a valve or a mass flow controller of the gas supply mechanism 16, an input device (e.g., a keyboard and a mouse), an output device (e.g., a printer), a display device (e.g., a display), and a storage device (e.g., a storage medium). The main controller of the controller 50 causes the plasma film-forming apparatus 100 to execute a predetermined operation based on a processing recipe stored in the storage medium built in the storage device or a storage medium set in the storage device.

<Plasma Film-Forming Method>

Figure 2:
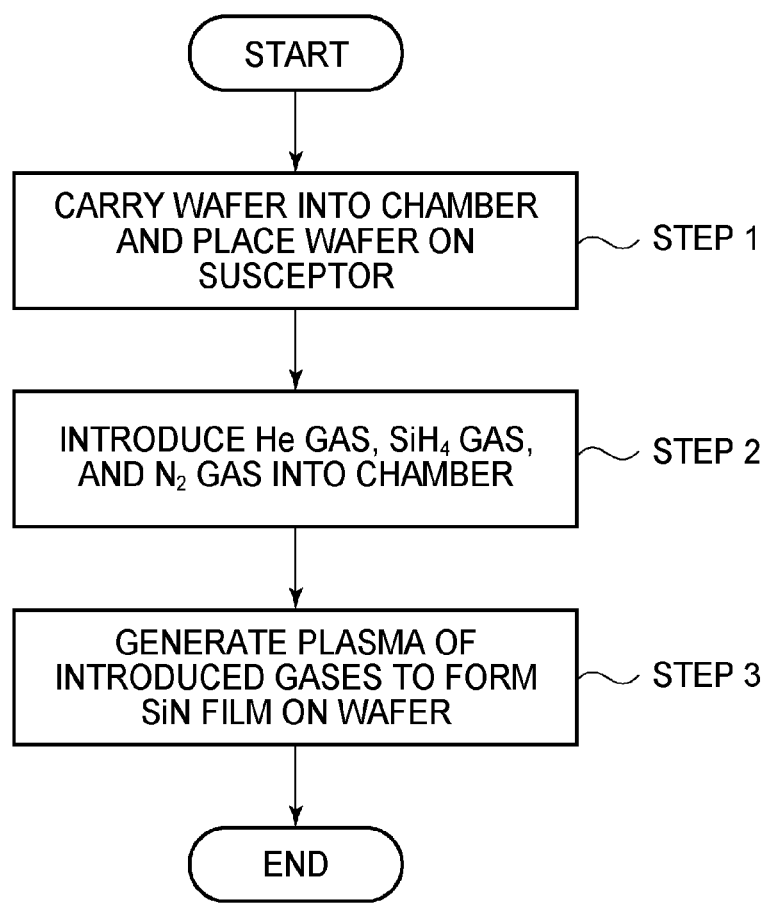
FIG. 2 is a flowchart illustrating an exemplary embodiment of the plasma film-forming method.

Next, an exemplary embodiment of a plasma film-forming method using the plasma film-forming apparatus 100 configured in this way will be described with reference to a flowchart of FIG. 2.

First, the gate valve 26 is opened, and a wafer W as a workpiece is carried into the chamber 1 from the carry-in/out port 25 and placed on the susceptor 2 (step 1).

Next, the inside of the chamber 1 is adjusted to a predetermined pressure, and, a Si source gas (e.g., $SiH_4$ gas), a nitrogen-containing gas (e.g., $N_2$ gas), and a plasma generation gas (e.g., He gas) are introduced from the gas supply mechanism 16 into the chamber 1 via the gas introduction portion 15 (step 2). Then, microwaves with a predetermined power are introduced from the microwave generator 39 into the chamber 1 to generate plasma, and a SiN film is formed on the wafer W by plasma CVD (step 3).

Step 3 will be described in detail.

The microwaves with a predetermined power are guided from the microwave generator 39 to the waveguide 37 via the matching circuit 38. The microwaves guided to the waveguide 37 are propagated through the rectangular waveguide 37b in the TE mode. The TE mode of the microwaves is converted into the TEM mode by the mode converter 40, and the microwaves are propagated through the coaxial waveguide 37a in the TEM mode. Then, the microwaves in the TEM mode are transmitted through the slow-wave plate 33, the slots 32 of the planar antenna 31, and the microwave-transmitting plate 28, and are radiated into the chamber 1.

The microwaves spread as a surface wave only in a region directly under the microwave-transmitting plate 28, so that surface wave plasma is generated. Then, the plasma is dispersed downward and becomes plasma of high electron density and low electron temperature in the region where the wafer W is arranged.

The Si source gas and the nitrogen-containing gas are excited by the plasma and dissociated into active species such as, for example, SiH and NH, which are reacted on the wafer W to form a SiN film.

Incidentally, in order to stably generate the plasma, a plasma generating gas has been conventionally used. Conventionally, Ar gas has been widely used as a plasma generating gas because it is cost effective and industrially advantageous. The possibility of using a rare gas other than Ar gas is mentioned in, for example, Japanese Patent Laid-Open Publication No. 2011-77323, but it is considered that the rare gas has the same function as Ar gas. In addition, the rare gas other than Ar gas is rarely used.

However, when Ar gas is used as the plasma generation gas, it has been found that it is difficult to satisfy the demand for film thickness uniformity and film quality uniformity required in response to recent miniaturization of semiconductor devices.

That is, since Ar gas is a high atomic weight element, it is difficult to spread uniformly. In addition, when the Ar gas is ionized and collides with a film on the wafer W, the film is likely to be damaged. Thus, sufficient film thickness uniformity and film quality uniformity cannot be obtained and may rather be deteriorated.

When a plasma processing is performed without using argon gas in order to avoid such a problem, plasma stability may be insufficient.

Therefore, as a result of investigating other plasma generating gases, it has been newly found that, when He gas is used, desired film thickness uniformity and film quality uniformity may be obtained after the function of stabilizing the plasma is maintained.

That is, He gas is easily ionized and functions as a plasma generating gas. In addition, since He gas is a light element having a low atomic weight, it easily spreads and has an effect of spreading and uniformizing the plasma. Furthermore, because of the low atomic weight, He gas hardly imparts plasma damage to the film on the wafer W unlike Ar gas. Therefore, when He gas is supplied as a plasma generating gas, desired film thickness uniformity and film quality uniformity may be obtained while plasma is stabilized.

At this time, the partial pressure ratio (flow rate ratio) between the Si source gas and the nitrogen-containing gas ($SiH_4$ gas+$N_2$ gas) serving as the film-forming gas, and He gas is in a range of 0.15 to 2.5 (i.e., the film-forming gas and He gas is 0.15:1 to 2.5:1).

Preferred ranges of other conditions when $SiH_4$ gas is used as the Si source gas and $N_2$ gas is used as the nitrogen-containing gas are as follows.

Processing temperature (temperature of the surface of the susceptor 2): 250° C. to 550° C.

Processing pressure: 6.5 Pa to 100 Pa (50 mTorr to 750 mTorr)

He gas flow rate: 100 mL/min (sccm) to 400 mL/min (sccm)

$SiH_4$ gas flow rate: 10 mL/min (sccm) to 200 mL/min (sccm)

$N_2$ gas flow rate: 10 mL/min (sccm) to 200 mL/min (sccm)

Microwave power density: 0.01 $W/cm^2$ to 0.04 $W/cm^2$

As described above, according to the exemplary embodiment, when He gas is used as the plasma generation gas, it is possible to generate highly stable and uniform plasma and to obtain a SiN film with high uniformity such as, for example, film thickness uniformity and film quality uniformity.

Test Example

Next, a test example will be described.

Here, in forming the SiN film by plasma CVD using the plasma film-forming apparatus illustrated in FIG. 1, the film thickness uniformity was compared between the case where He gas was not added as a plasma generation gas and the case where He gas was added.

Figure 3A:
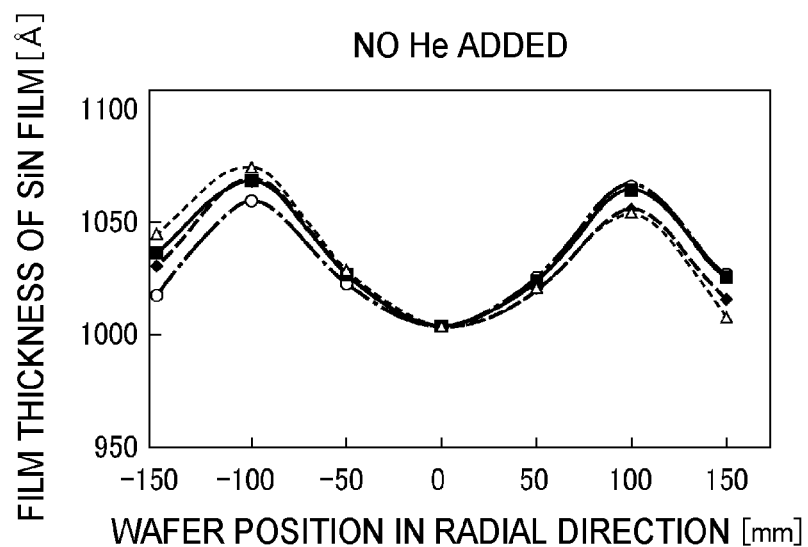
FIGS. 3A and 3B are graphs each illustrating a comparison of film thickness uniformity between a case where no He gas is added and a case where He gas is added.
Figure 3B:
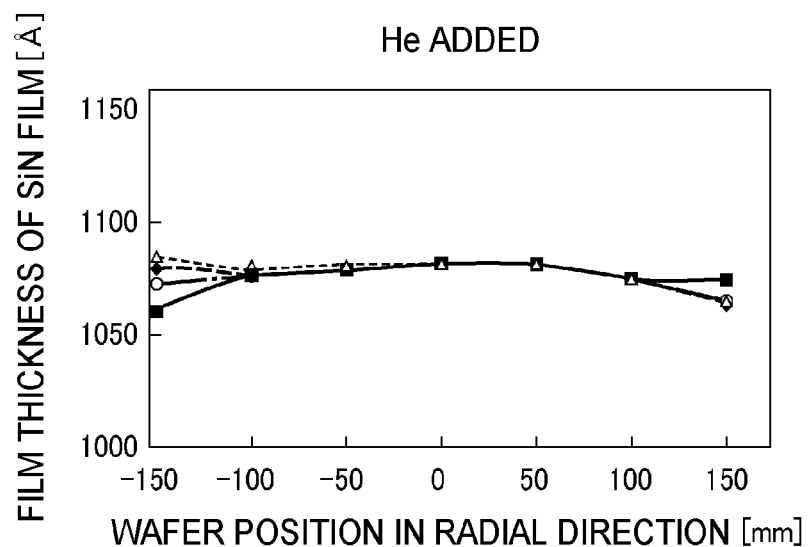

FIGS. 3A and 3B illustrate the results. FIG. 3A is a graph illustrating a film thickness distribution in the radial direction of the wafer in the case where He gas is not added, and FIG. 3B is a graph illustrating a film thickness distribution in the radial direction of the wafer in the case where He gas is added at a flow rate of 200 sccm. The film thickness distribution was determined for four radial directions of the wafer. In addition, the film thickness distribution in the circumferential direction of the wafer was also determined.

Conditions other than the He gas supply conditions are the same in both cases and are as follows.

$SiH_4$ gas flow rate: 90 sccm
$N_2$ gas flow rate: 70 sccm
Microwave power density: 2.78 $W/cm^2$
Processing time: 80 seconds As illustrated in FIG. 3A, when the He gas was not added, film thickness non-uniformity was observed, in which the film thickness increases toward the periphery from the center of the wafer and the film thickness decreases at the peripheral portion. And, the film thickness range (16) was 6.9%. On the other hand, as illustrated in FIG. 3B, when He gas was added, the film thickness was substantially flat, and the film thickness range was 3.0%. Further, the film thickness range in the circumferential direction at a position of a radius of 147 mm was 6.0% in the case where He gas was not added, whereas it was 1.1% in the case where He gas was added. From the results, it was confirmed that film thickness uniformity was remarkably enhanced by adding He gas.

Next, an investigation was made on film thickness uniformity and film quality uniformity due to the presence or absence of addition of He gas when the SiN film was formed under various conditions.

Here, the processing conditions were adjusted within the following ranges and some hard adjustment was also performed, and the film thickness uniformity and the film quality uniformity were investigated in the case where He gas was not added and the case where He gas was added (100 sccm to 400 sccm).

Figure 4:
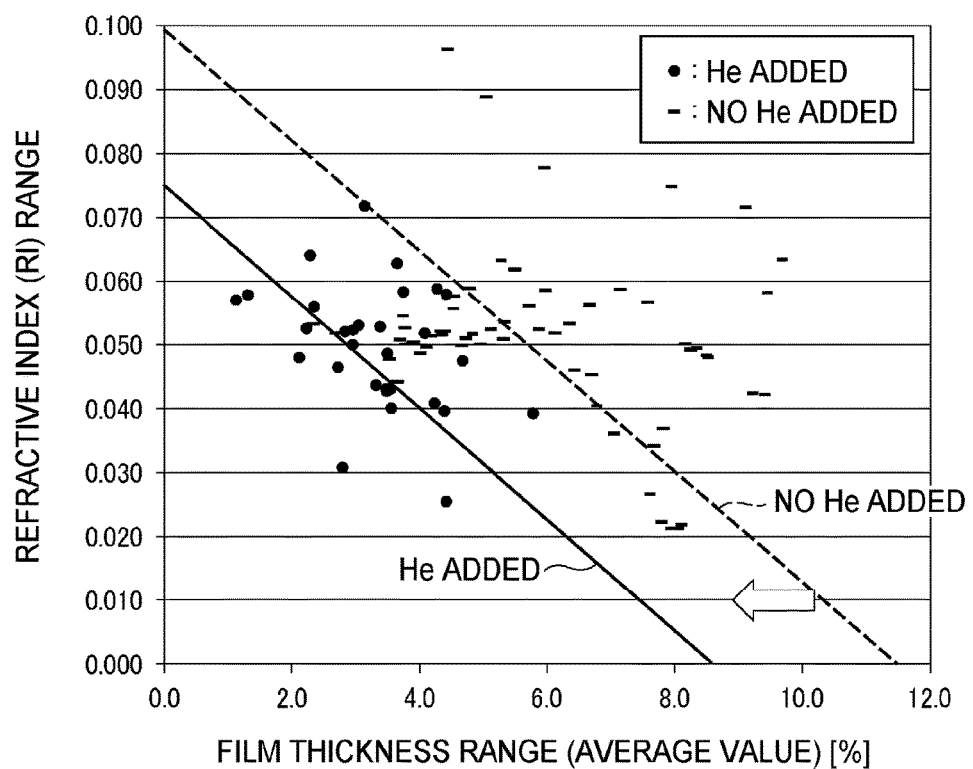
FIG. 4 is a view obtained by plotting average film thickness ranges (%) and refractive index (RI) ranges in the case where He gas is not added and the case where He gas is added.

Film Forming Conditions
$SiH_4$ gas flow rate: 10 sccm to 200 sccm
$N_2$ gas flow rate: 5 sccm to 200 sccm
Microwave power density: 2.43 $W/cm^2$ to 3.34 $W/cm^2$
Processing time: 10 sec to 200 sec The film thickness uniformity was obtained from the average value (%) of the film thickness range. A refractive index (RI) of the film was used as an index of the film quality, and the film quality uniformity was obtained from the refractive index range. FIG. 4 is a view obtained by plotting the average film thickness ranges (%) and the refractive index (RI) ranges in the case where He gas is not added and the case where He gas is added.

As illustrated in FIG. 4, it has been confirmed that, when He gas is added, both the average values of the film thickness ranges and the refractive index ranges tend to decrease as compared with the case where He gas is not added, and both the film thickness uniformity and the film quality uniformity were improved by adding He gas.

<Other Applications>

For example, in the exemplary embodiment, descriptions have been made on a case where the SiN film is formed by plasma CVD using an RLSA (registered trademark) microwave plasma processing apparatus. However, the plasma may be other types of microwave plasma or any plasma other than the microwave plasma such as, for example, inductively coupled plasma. Further, the film to be formed is not limited to the SiN film. The present disclosure may be applied to film formation of other films.

Further, in the exemplary embodiment, descriptions have been made on the case of using a semiconductor wafer as a workpiece, but the workpiece is not limited to the semiconductor wafer, but may be another workpiece such as, for example, a glass substrate or a ceramic substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma film-forming method comprising:
placing a workpiece within a chamber;
supplying a film-forming gas into the chamber;
generating plasma within the chamber; and
exciting the film-forming gas by the plasma to form a predetermined film on the workpiece,
wherein helium gas is supplied as a plasma generating gas into the chamber together with the film-forming gas to generate plasma containing the helium gas in the chamber, and
wherein a partial pressure ratio of the film-forming gas to the helium gas is in a range of 0.15 to 2.5.

2. The plasma film-forming method of claim 1, wherein the plasma generated within the chamber is microwave plasma.

3. The plasma film-forming method of claim 2, wherein the microwave plasma is generated by an RLSA (registered trademark) microwave plasma processing apparatus.

4. The plasma film-forming method of claim 1, wherein the film-forming gas includes a silicon source gas and a nitrogen-containing gas to form a silicon nitride film as the predetermined film.

5. The plasma film-forming method of claim 4, wherein a processing temperature of the workpiece is in a range of 250° C. to 550° C.

6. The plasma film-forming method of claim 4, wherein a processing pressure within the chamber is in a range of 6.5 Pa to 100 Pa.

7. The plasma film-forming method of claim 1, wherein the predetermined film comprises SiN.

8. The plasma film-forming method of claim 1, wherein the film-forming gas does not comprise Argon.

9. The plasma film-forming method of claim 4, wherein the silicon source gas comprises $SiH_4$, the nitrogen-containing gas comprises $N_2$, and the silicon nitride film comprises SiN.

10. The plasma film-forming method of claim 9, wherein:
the processing temperature of the workpiece is in a range of 250° C. to 550° C.,
the processing pressure of the workpiece is in a range of 6.5 Pa to 100 Pa,
the flow rate of the He gas is in a range of 100 mL/min (sccm) to 400 mL/min,
the flow rate of the $SiH_4$ gas is in a range of 10 mL/min (sccm) to 200 mL/min,
the flow rate of the $N_2$ gas is in a range of 10 mL/min (sccm) to 200 mL/min, and
the microwave power density is in a range of 0.01 $W/cm^2$ to 0.04 $W/cm^2$.

* * * * *